United States Patent [19]

Melcher et al.

[11] 4,074,240

[45] Feb. 14, 1978

[54] MAGNETOELASTIC STORAGE DEVICE

[75] Inventors: Robert Lee Melcher, Yorktown Heights; Norman Steven Shiren, Ossining, both of N.Y.

[73] Assignee: International Business Machines Corporation, Armonk, N.Y.

[21] Appl. No.: 659,872

[22] Filed: Feb. 20, 1976

[51] Int. Cl.[2] ............................................. G11C 11/02
[52] U.S. Cl. ..................................... 365/192; 360/56; 365/157
[58] Field of Search ...... 340/174 R, 174 RF, 173 NI, 340/173.2; 360/56

[56] References Cited

U.S. PATENT DOCUMENTS

| | | | |
|---|---|---|---|
| 3,585,494 | 6/1971 | Bozanic et al. | 340/174 NI |
| 3,593,159 | 7/1971 | Kaplan | 340/174 NI |
| 3,821,636 | 6/1974 | Bozanic et al. | 340/174 NI |

OTHER PUBLICATIONS

Journal of Applied Physics-vol. 39, No. 1, Jan. 1968, pp. 81-88, 340-174 NI.

Primary Examiner—James W. Moffitt
Attorney, Agent, or Firm—Bernard N. Wiener

[57] ABSTRACT

Information storage is achieved in powdered magnetoelastic materials. Such powdered magnetoelastic materials have the capability of achieving long storage times of information and also allow information to be stored at relatively high temperatures.

10 Claims, 2 Drawing Figures

MAGNETOELASTIC STORAGE DEVICE

BACKGROUND OF THE INVENTION

In a paper entitled "Magnetoacoustic Excitation of Radio-Frequency Resonances and Echoes in Magnetic Materials" by M. Rubinstein et al which appeared in the January 1968 Journal of Applied Physics, Vol. 19, Number 1, pp. 81-88, powdered magnetoacoustic garnets and ferrites were used to produce echo pulses after an r. f. excitation of the powder. However, their circuit for producing echo pulses did not involve storage of information. In a sample of magnetoacoustic powder such as lithium ferrite, Rubinstein et al excited the powder at time $t=0$ with an intense, short r. f. pulse and, at a time $t=\tau$ later, a second short intense pulse of the same frequency was applied to the powder. As a consequence of said second applied pulse, an echo pulse, having the same fundamental frequency as the excitation pulse, was produced at a time after the second pulse equal to the time interval between the two exciting pulses. The echo pulse had a decay time of $T_2$. When a third pulse of the same frequency as the first two pulses was applied to the powder at time T after the first echo a second echo appeared. However, the decay time $T_1$ of the second echo pulse obeyed the relation $T_1 = T_2/2$. Since $T_2$ is very short, less than one millisecond, the third pulse, which served as a reading pulse, had to be applied at a time T that was of the order of one millisecond. It is obvious that such a device cannot be used as a useful memory or storer of information.

The present invention employs powdered magnetoelastic materials, like Rubinstein et al, but by choosing appropriate minimum energy levels for our exciting pulses and selecting specific magnetoelastic powders, information storage, as long as several minutes and greater, can be achieved.

Consequently it is an object of this invention to employ magnetoelastic powders in a resonant circuit so as to achieve useful storage times of information applied as an r. f. signal to said powders.

DETAILED DESCRIPTION OF THE INVENTION

Figure 1:
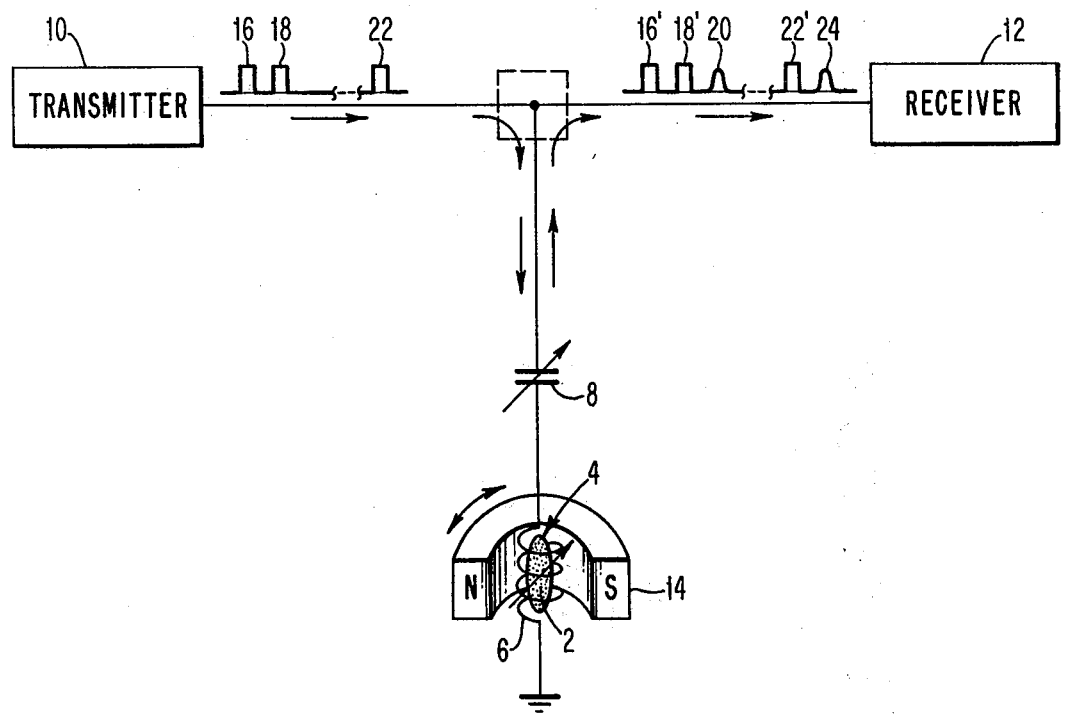
FIG. 1 is a schematic representation of the basic invention.

As seen in FIG. 1 a magnetoelastic material such as $Y_3Fe_5O_{12}$ (YIG) or $Gd_3Fe_5O_3$ (GdIG) is ground into powdered particles 2 and maintained in a suitable container such as a sealed or corked glass tube 4. The container 4 is placed within a coil 6 that is grounded at one end and connected at its other end to a variable capacitor 8. A transmitter 10 is connected to a resonant circuit comprising the capacitor 8 and coil 6 and such transmitter 10 is capable of transmitting r. f. signals and a receiver 12 is also connected to the resonant circuit for receiving signals radiated by said resonant circuit. Surrounding coil 6 is a rotatable d.c. magnet 14 that can apply a steady magnetic field at any angle to the r. f. magnetic field produced by r. f. current in coil 6.

In one series of experiments, $Y_3Fe_5O_{12}$ (YIG) particles of about 30-150 microns in diameter were used where the frequency range of input pulses into the resonant circuit was 10-100 MHz. The fundamental mechanical frequency $f$ of a YIG particle of diameter $d$ is given by the approximate formula $f \simeq v/2d$, where $v$ is the phase velocity of an acoustic wave in the powder in cm/sec. For a particle diameter of $d=50$ microns and an acoustic wave velocity of $5\times 10^5$ cm/sec, the fundamental mechanical resonance frequency $\simeq 50$ MHz.

Figure 2:
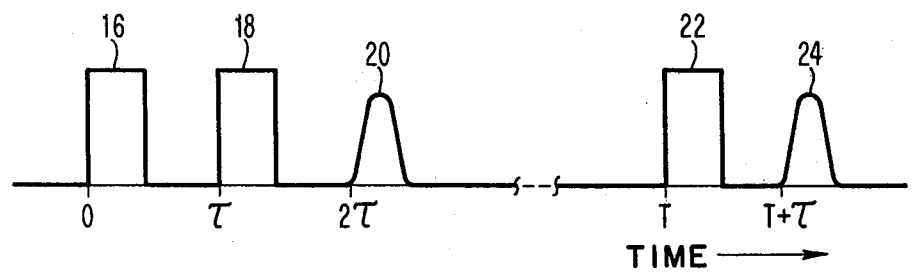
FIG. 2 is a pulse diagram for assisting in the understanding of the invention, using a three pulse echo system for achieving storage in a magnetoelastic powder.

With powdered particles of YIG of $\sim 50$ microns in diameter in tube 4, a first r. f. pulse 16, one microsecond wide and having a frequency of 50 MHz and having a peak power of 500 watts was applied to the resonant circuit. This pulse is also received by the receiver 12 as the pulse 16'. The first pulse 16 served as an information-bearing signal and caused the powdered magnetic particles 2 to mechanically oscillate at their natural frequency. A second pulse 18, having the same frequency, pulse width and peak power as the first pulse 16, was applied at time $\tau$ after pulse 16 and such second pulse caused individual powder particles 2 to rotate, such rotation resulting in a new orientation of the powder particles 2. Such new orientation served to "store" the information carried by pulse 16. Pulses 18 and 22 are received by the receiver 12 as are the pulses 18' and 22'. After termination of pulse 18 an "echo" pulse 20 is radiated by the powder (see FIG. 2), which echo pulse appears at time $2\tau$ at the receiver and has a decay time $T_2$. For optimum results for storage, it is preferred that the second pulse 18 have the same pulse width and peak power as pulse 16, but storage is still achieved if these pulse widths and peak powers differ.

Where this invention differs from the teaching of the above noted Rubinstein et al paper is that a third pulse 22, having the same frequency as pulses 16 and 18, can be applied at a time T which is unrelated to the decay time $T_2$ of echo pulse 20. Such times T are many orders of magnitude greater than decay time $T_2$ of echo pulse 20. In some instances, where YIG was used the time T, or readout time, could be minutes after the decay of echo pulse 20 at a temperature of 300° K. In general, the two pulse echo amplitude, $e_2$, varies with the separation, $\tau$, of the pulses 16 and 18 as:

$$e_2 \alpha\ e{-2\tau/T_2}$$

where $e_2$ is the amplitude of the radiated echo pulse 20, and $T_2$ is the decay time of echo pulse 20. The three pulse echo amplitude, $e_3$, varies with the separation, $\tau$, of the pulses 16 and 18 and the time T of the pulse 22 as:

$$e_3 \alpha\ e(-2\tau/T_2}e\ (-T/T_1)$$

where $e_3$ is the amplitude of the radiated three pulse echo 24, T is the time of the applied pulse 22 and $T_1$ is the decay or storage time of the stored information.

The use of high power r. f. pulses 16 and 18 causes the particles in the magnetoelastic powder to reorient during the time of the pulse 18. This reorientation is maintained by the particles 2 of the powder for the time $T_1$. The information stored as this particle reorientation can be recovered (i.e., readout) through application of the third pulse 22 at time T as long as T $T_1$. As a consequence of this reorientation we achieve decay times $T_1$ which greatly exceed $T_2$ and can be the order of several minutes at 300K.

It is noted that FIG. 1 includes a d. c. magnet 14 that is rotatable about the powdered magnetoelastic particles 2 so that its magnetic field $H_o$ can be disposed at an angle to the magnetic field $H_{rf}$. In order to excite magnetoelastic oscillations in the resonant circuit containing the magnetoacoustic powders, the magnetic and elastic modes must be strongly coupled. Such coupling is accomplished by applying a d. c. magnetic field $H_o$. For low frequencies, i.e., $f = (\omega/2\rho) = 3 \times 10^7 H_z$, and assuming substantially spherical powdered magnetoelastic particles 2 and $H_{rf}$ being perpendicular to $H_o$, maximum magnetoelastic excitation occurs when $H_{om} = 4\pi M_s/3$, where $M_s$ is the saturation magnetization of the material. In YIG, $H_{om}$ is 590 oersteds. In GdIG, $H_o$ is 20 oersteds for this maximum coupling and $H_{om} \perp H_{rf}$ at 300° K.

It is believed that the long readout time T (hence, a useful memory) obtained when using magnetoelastic powders is due to the physical rotation of the individual particles as a consequence of the torque exerted on an oscillating dipole by an applied r. f. field. In the present case, a minimum of 300 watts peak power delivered to the resonant circuit provides this physical rotation. Thus the information-bearing pulse 16 causes the powdered particles 2 to oscillate and the powerful second pulse of 300 or more watts, with the higher wattage preferred, rotates the particles to a new orientation that is relatively longlived. Such long life allows for readout pulse 22 to be considerably delayed before it is applied to the resonant circuit to read out the information contained in pulse 16. An echo pulse 24 is sensed by receiver 12 at a time T + $\tau$ after pulse 22 was applied.

The amplitude of echo pulse 24 is dependent upon the frequency of the r. f. pulses 16, 18 and 22 and the particle size of the magnetoelastic powder 2. The particle size-frequency dependence indicates that mechanical oscillations of individual particles are excited by the pulses 16 and their high amplitudes 18 and play an important role in increasing the storage times of the magnetoelastic powders serving as memories. In the present case, where YIG and GdIG were chosen as representative of magnetoelastic particles, peak powers of 300 or more watts are needed to drive the resonant circuit of this invention to achieve such increased storage times.

We claim:

1. A device for obtaining storage and readout of information comprising:

a powdered magnetoelastic material having a plurality of particles each with its own mechanical resonance frequency and each with its own original orientation, a tuned electrically resonant circuit comprising a variable capacitor and a coil wherein said material is located within said coil for providing an oriented radiofrequency magnetic field within said material, a d. c. magnet for applying a magnetic field to said powder at an angle to the field created by radiofrequency current through said coil, means for applying a first r. f. pulse as an information-bearing pulse to said electrically resonant circuit for causing said particles of said powdered material to oscillate mechanically at said mechanical resonance frequencies, means for applying a second r. f. pulse with peak power above a minimum power to said electrically resonant circuit to cause said mechanically oscillating particles to rotate to new orientations because said minimum power is exceeded, said second r. f. pulse serving to store the information-bearing pulse as said new orientations, and means for applying a third r. f. pulse to said electrically resonant circuit so as to obtain a readout signal of said stored information.

2. The device of claim 1 wherein said powdered magnetoelastic material is $Gd_3Fe_5O_3$.

3. The device of claim 1 wherein said d. c. magnetic field is perpendicular to the magnetic field produced by current through said coil.

4. The device as set forth in claim 1 wherein said storage is for at least two minutes.

5. The device as set forth in claim 1 wherein said applied pulses have a peak power of at least 300 watts applied to said resonant circuit.

6. The device of claim 1 wherein said powdered magnetoelastic material is $Y_3Fe_5O_{12}$.

7. The device of claim 6 wherein the particle powders of $Y_3Fe_5O_{12}$ have diameters between 30–150 microns.

8. A device for obtaining storage and readout of information comprising:

a powdered magnetoelastic material having a plurality of particles each with its own mechanical resonance frequency and each with its own original orientation, a tuned electrically resonant circuit including a coil wherein said material is located within said coil for providing an oriented radiofrequency magnetic field within said material, means for applying a first r. f. pulse as an information-bearing pulse to said electrically resonant circuit for causing said particles of said powdered material to oscillate mechanically at said mechanical resonance frequencies, means for applying a second r. f. pulse with peak power above a minimum power at time $\tau$ to said electrically resonant circuit to cause said oscillating particles to rotate to new orientations, said second r. f. pulse serving to store the information-bearing pulse as said new orientations because said minimum power is exceeded and also to produce an echo pulse at time 2 $\tau$ having a decay time $T_2$, and means for applying a third r. f. pulse to said electrically resonant circuit at time T so as to obtain a readout signal of said stored information.

9. The device as set forth in claim 8 wherein said time T is at least one order greater than time $T_2$ and said r. f. pulses have peak powers of at least 300 watts.

10. The device as set forth in claim 8 wherein said storage is for at least two minutes.

* * * * *